(12) United States Patent
Huang

(10) Patent No.: US 11,830,836 B2
(45) Date of Patent: Nov. 28, 2023

(54) SEMICONDUCTOR DEVICE WITH WIRE BOND AND METHOD FOR PREPARING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Tapei (TW)

( * ) Notice: Subject to any disclaimer, the term of this patent is extended or adjusted under 35 U.S.C. 154(b) by 271 days.

(21) Appl. No.: 17/493,820

(22) Filed: Oct. 4, 2021

(65) Prior Publication Data

US 2023/0106386 A1 Apr. 6, 2023

(51) Int. Cl.
*H01L 23/00* (2006.01)
*H01L 21/48* (2006.01)
*H01L 23/488* (2006.01)
*H01L 23/532* (2006.01)

(52) U.S. Cl.
CPC .......... *H01L 24/05* (2013.01); *H01L 21/4828* (2013.01); *H01L 23/488* (2013.01); *H01L 23/53238* (2013.01)

(58) Field of Classification Search
CPC ... H01L 24/05; H01L 21/4828; H01L 23/488; H01L 23/53238; H01L 24/03; H01L 24/85; H01L 24/45; H01L 24/48; H01L 2224/0382; H01L 2224/45147; H01L 2224/45184; H01L 2224/85375; H01L 2224/48463; H01L 23/3192
See application file for complete search history.

(56) References Cited

U.S. PATENT DOCUMENTS

| | | | | |
|---|---|---|---|---|
| 9,799,624 | B1 * | 10/2017 | Lin | H01L 24/85 |
| 9,853,005 | B2 * | 12/2017 | Maeda | H01L 24/48 |
| 2015/0333030 | A1 * | 11/2015 | Akiba | H01L 24/43 257/766 |
| 2017/0229410 | A1 * | 8/2017 | Hou | H01L 24/11 |
| 2019/0013290 | A1 * | 1/2019 | Qin | H01L 24/05 |
| 2021/0111102 | A1 | 4/2021 | Gambino et al. | |
| 2021/0134742 | A1 * | 5/2021 | Chockalingam | H01L 24/03 |

FOREIGN PATENT DOCUMENTS

| | | |
|---|---|---|
| CN | 102132400 A | 7/2011 |
| TW | 201517335 A | 5/2015 |
| TW | 201622182 A | 6/2016 |

OTHER PUBLICATIONS

Office Action dated May 15, 2023 related to Taiwanese Application No. 111100338.

* cited by examiner

*Primary Examiner* — Thanh T Nguyen
(74) *Attorney, Agent, or Firm* — Xuan Zhang

(57) ABSTRACT

A semiconductor device includes a semiconductor substrate having a bonding pad, and a first dielectric layer disposed over the semiconductor substrate. A portion of the bonding pad is exposed by the first dielectric layer. The semiconductor device also includes a metal oxide layer disposed over the portion of the bonding pad, and a wire bond penetrating through the metal oxide layer to bond to the bonding pad. The portion of the bonding pad is entirely covered by the metal oxide layer and the wire bond.

14 Claims, 20 Drawing Sheets

SEMICONDUCTOR DEVICE WITH WIRE BOND AND METHOD FOR PREPARING THE SAME

TECHNICAL FIELD

The present disclosure relates to a semiconductor device and a method for preparing the same, and more particularly, to a semiconductor device with a wire bond and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, wafer level chip scale packaging (WLCSP) is widely used for its low cost and relatively simple processes. Furthermore, numerous manufacturing operations are implemented within such small semiconductor devices.

However, the manufacturing and integration of semiconductor devices involve many complicated steps and operations. An increase in the complexity of manufacturing and integration of semiconductor devices may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a semiconductor substrate having a bonding pad, and a first dielectric layer disposed over the semiconductor substrate. A portion of the bonding pad is exposed by the first dielectric layer. The semiconductor device also includes a metal oxide layer disposed over the portion of the bonding pad, and a wire bond penetrating through the metal oxide layer to bond to the bonding pad. The portion of the bonding pad is entirely covered by the metal oxide layer and the wire bond.

In some embodiments, the bonding pad includes copper (Cu). In some embodiments, the metal oxide layer includes tantalum (Ta), tantalum nitride (TaN), titanium (Ti), titanium nitride (TiN), or a combination thereof. In some embodiments, the metal oxide layer includes a splash structure protruding from a top surface of the metal oxide layer, and a bottom surface of the wire bond is surrounded by and in direct contact with the splash structure of the metal oxide layer.

In some embodiments, the semiconductor device further includes a second dielectric layer disposed over the first dielectric layer, and a third dielectric layer disposed over the second dielectric layer, wherein the first dielectric layer, the second dielectric layer and the third dielectric layer have substantially aligned sidewalls. In some embodiments, the semiconductor device further includes a polymer layer covering a top surface of the third dielectric layer and the sidewalls of the first dielectric layer, the second dielectric layer and the third dielectric layer. In some embodiments, the polymer layer is in direct contact with the metal oxide layer and the wire bond.

In another embodiment of the present disclosure, a semiconductor device is provided. The semiconductor device includes a semiconductor substrate having a bonding pad, and a dielectric stack disposed over the semiconductor substrate. A top surface of the bonding pad is exposed by the dielectric stack. The semiconductor device also includes a wire bond physically bonded to the top surface of the bonding pad, and a metal oxide layer disposed over the top surface of the bonding pad. The metal oxide layer is in direct contact with a bottom surface of the wire bond and sidewalls of the dielectric stack.

In some embodiments, the metal oxide layer surrounds and mechanically supports the bottom surface of the wire bond. In some embodiments, the bonding pad includes copper (Cu), and the metal oxide layer includes tantalum (Ta), tantalum nitride (TaN), titanium (Ti), titanium nitride (TiN), or a combination thereof. In some embodiments, the dielectric stack includes a first dielectric layer, a second dielectric layer disposed over the first dielectric layer, and a third dielectric layer disposed over the second dielectric layer, wherein the first dielectric layer and the second dielectric layer are made of different materials.

In some embodiments, an interface between the first dielectric layer and the second dielectric layer is higher than a topmost surface of the metal oxide layer. In some embodiments, the semiconductor device further includes a polymer layer disposed between the wire bond and the dielectric stack, wherein the polymer layer is in direct contact with a top surface of the metal oxide layer. In some embodiments, the polymer layer includes polyimide.

In yet another embodiment of the present disclosure, a method for forming a semiconductor device is provided. The method includes providing a semiconductor substrate having a bonding pad, and forming a first dielectric layer over the bonding pad. The method also includes etching the first dielectric layer to expose a top surface of the bonding pad, and selectively depositing a metal oxide layer over the top surface of the bonding pad. The method further includes bonding a wire bond to the semiconductor substrate. The wire bond penetrates through the metal oxide layer to physically contact the bonding pad.

In some embodiments, the metal oxide layer is selectively deposited by an atomic layer deposition (ALD) process. In some embodiments, before the top surface of the bonding pad is exposed, the method further includes forming a second dielectric layer over the first dielectric layer, forming a third dielectric layer over the second dielectric layer, forming a patterned mask over the third dielectric layer, and etching the first dielectric layer, the second dielectric layer and the third dielectric layer using the patterned mask as an etching mask to expose the top surface of the bonding pad.

In some embodiments, before the wire bond is bonded to the semiconductor substrate, the method further includes depositing a polymer layer covering the first dielectric layer and the metal oxide layer, and etching the polymer layer to expose a top surface of the metal oxide layer. In some embodiments, the wire bond is separated from the first dielectric layer by the polymer layer. In some embodiments, after the top surface of the metal oxide layer is exposed, the method further includes etching the metal oxide layer using the polymer layer as an etching mask, and removing the polymer layer before the wire bond is bonded to the semiconductor substrate.

Embodiments of a semiconductor device with a wire bond and method for preparing the same are provided in the disclosure. In some embodiments, the semiconductor device includes a metal oxide layer disposed over a bonding pad, and a wire bond penetrating through the metal oxide layer to bond to the bonding pad. The bonding pad is entirely covered by the metal oxide layer and the wire bond after the bonding process. This protects the bonding pad from oxidation and contamination, and the metal oxide layer can provide mechanical support to the bottom surface of the wire bond. Moreover, the metal oxide layer is selectively deposited over the bonding pad without performing an oxidation process, which prevents detrimental impact on device performance. As a result, the performance of the semiconductor device can be enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
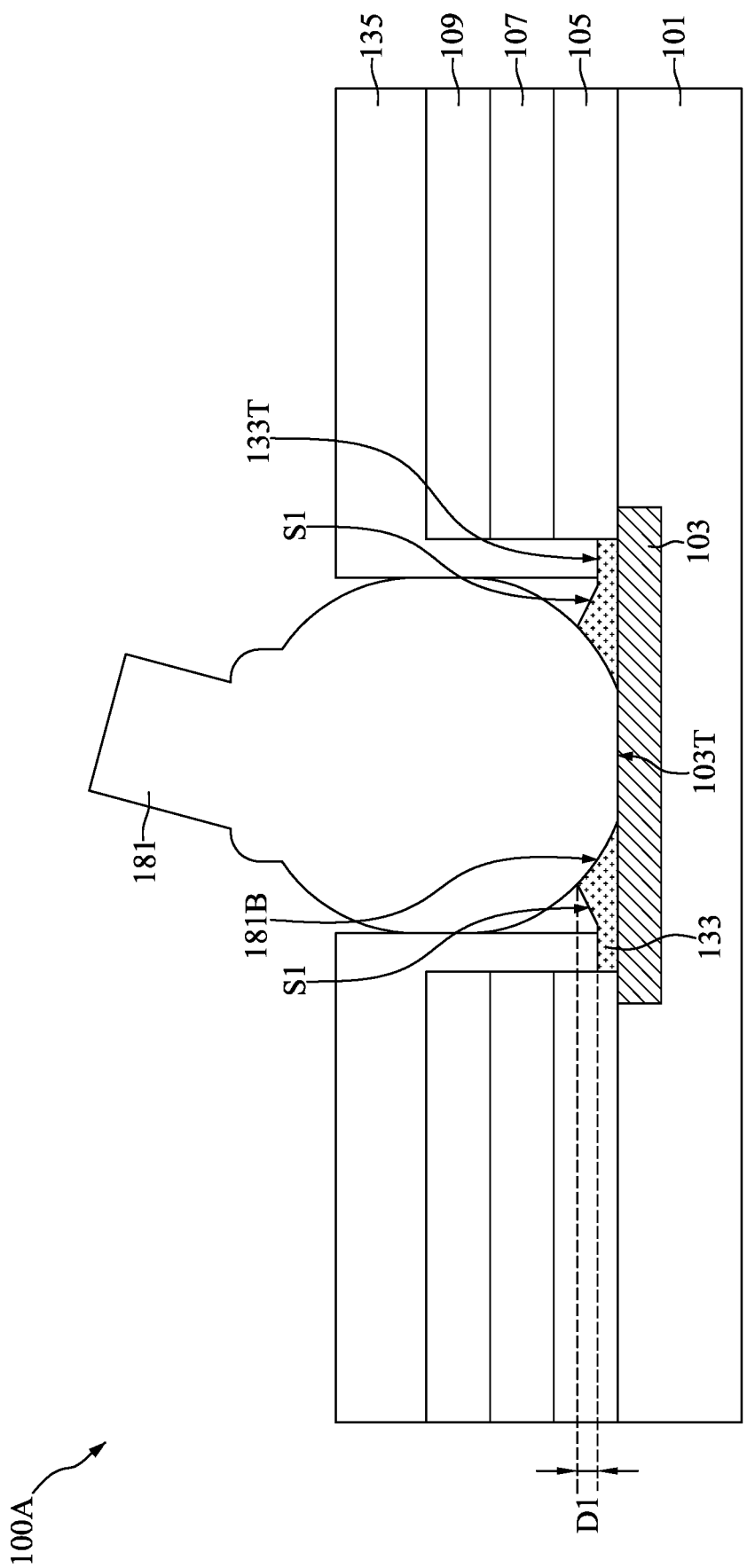
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100A, in accordance with some embodiments. In some embodiments, the semiconductor device 100A includes a semiconductor substrate 101 having a bonding pad 103, and a dielectric stack disposed over the semiconductor substrate 101. In some embodiments, the dielectric stack includes a first dielectric layer 105, a second dielectric layer 107 disposed over the first dielectric layer 105, and a third dielectric layer 109 disposed over the second dielectric layer 107.

In some embodiments, the first dielectric layer 105, the second dielectric layer 107 and the third dielectric layer 109 have substantially aligned sidewalls. Within the context of this disclosure, the word "substantially" means preferably at least 90%, more preferably 95%, even more preferably 98%, and most preferably 99%. In some embodiments, the top surface 103T of the bonding pad 103 is at least partially exposed by the dielectric stack.

In some embodiments, the first dielectric layer 105 and the second dielectric layer 107 are made of different materials. In some embodiments, one of the first dielectric layer 105 and the second dielectric layer 107 has a tensile stress, and the other one of the first dielectric layer 105 and the second dielectric layer 107 has a compressive stress, thereby creating zero stress or near zero stress between them.

In some embodiments, the semiconductor device 100A also includes a metal oxide layer 133 disposed over the top surface 103T of the bonding pad 103, and a polymer layer 135 covering the dielectric stack and the metal oxide layer 133. In some embodiments, the metal oxide layer 133 is in direct contact with the top surface 103T of the bonding pad 103. In some embodiments, the top surface and the sidewalls of the third dielectric layer 109, the sidewalls of the second dielectric layer 107, and the sidewalls of the first dielectric layer 105 are covered by the polymer layer 135. In addition, in some embodiments, the polymer layer 135 is in direct contact with the top surface 133T of the metal oxide layer 133.

In some embodiments, the bonding pad 103 includes copper (Cu) or another suitable conductive material. In some embodiments, the metal oxide layer 133 includes tantalum (Ta), tantalum nitride (TaN), titanium (Ti), titanium nitride (TiN), or a combination thereof. Alternatively, the metal oxide layer 133 may include other materials such as oxides of aluminum (Al), hafnium (Hf), zirconium (Zr), nickel (Ni), zinc (Zn) or combinations thereof. It should be noted that the metal oxide layer 133 can be used for preventing ion migration from the bonding pad 103 into adjacent regions. Moreover, the polymer layer 135 includes polyimide (PI), in accordance with some embodiments.

In some embodiments, the semiconductor device 100A further includes a wire bond 181 penetrating through the metal oxide layer 133 to physically contact the bonding pad 103. It should be noted that, the thickness of the metal oxide layer 133 is selected in accordance with a downward force applied when the wire bond 181 is bonded onto the semiconductor substrate 101. In some embodiments, the wire bond 181 is in direct contact with the bonding pad 103, the metal oxide layer 133, and the polymer layer 135. In some embodiments, the metal oxide layer 133 is in direct contact with the sidewalls of the first dielectric layer 105 and the bottom surface 181B of the wire bond 181.

In addition, the metal oxide layer 133 includes a splash structure S1 protruding from the top surface 133T of the metal oxide layer 133, and the bottom surface 181B of the wire bond 181 is surrounded by and in direct contact with the splash structure S1, in accordance with some embodiments. In some embodiments, the wire bond 181 is separated from the dielectric stack by the polymer layer 135. In some embodiments, the portion of the bonding pad 103 exposed by the dielectric stack is entirely covered by the metal oxide layer 133 and the wire bond 181. That is, the top surface 103T of the bonding pad 103 is not exposed to air or moisture in the environment and thus prevented from being oxidized or contaminated.

Figure 2:
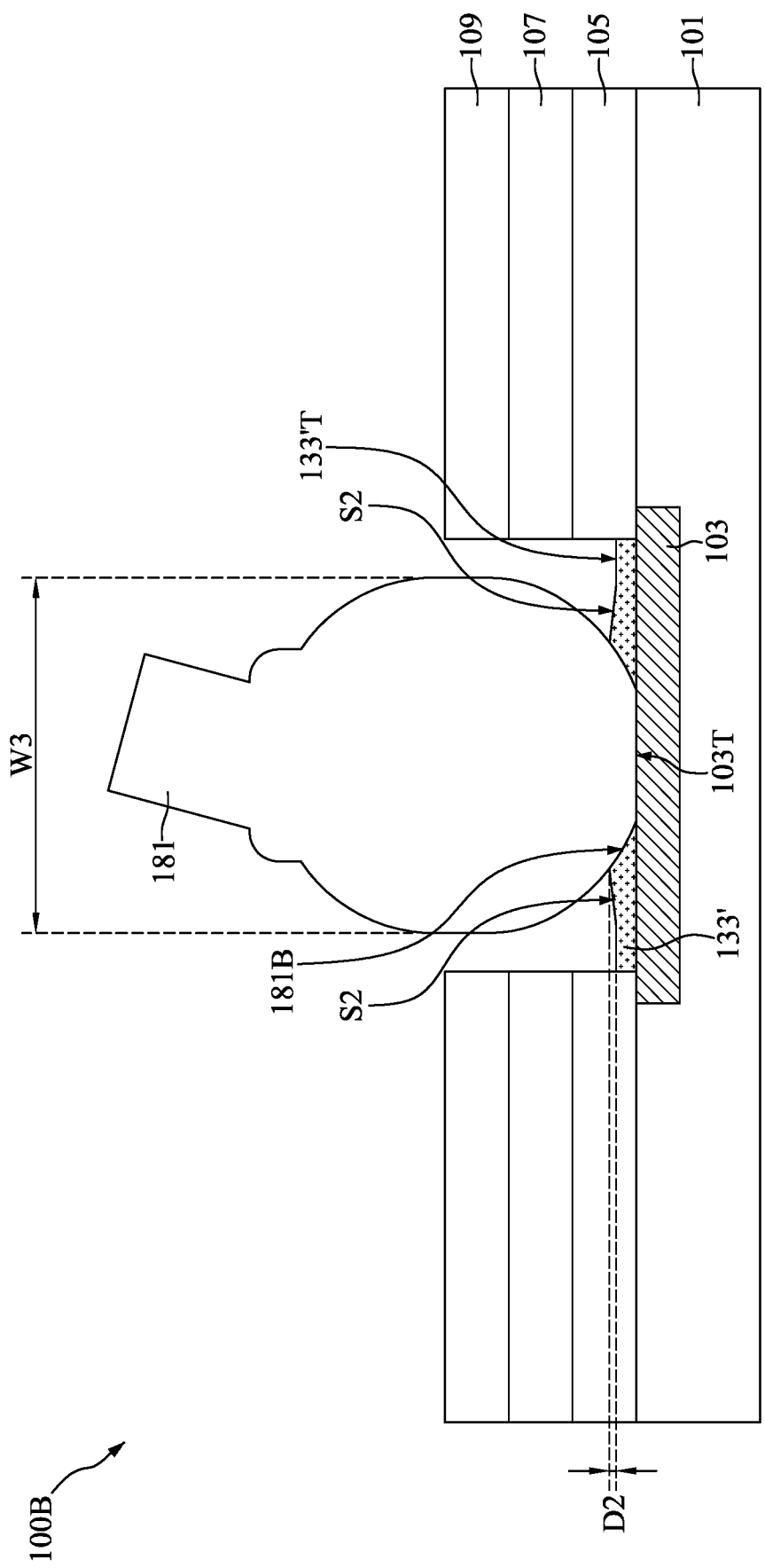
FIG. 2 is a cross-sectional view illustrating a semiconductor device, in accordance with some embodiments.

FIG. 2 is a cross-sectional view illustrating a semiconductor device 100B, in accordance with some embodiments. Semiconductor device 100B may be similar to the semiconductor device 100A, where same reference numbers refer to the same elements, and certain details or descriptions of the same elements are not repeated. Some differences are noted below. In the semiconductor device 100B, there is no polymer layer sandwiched between the wire bond 181 and the dielectric stack.

Moreover, the metal oxide layer 133' in the semiconductor device 100B includes a splash structure S2 protruding from the top surface 133'T of the metal oxide layer 133', and the bottom surface 181B of the wire bond 181 is surrounded by and in direct contact with the splash structure S2, in accordance with some embodiments.

In the semiconductor device 100A, there is a distance D1 between the topmost surface of the splash structure S1 and the top surface 133T of the metal oxide layer 133 covered by the polymer layer 135. In the semiconductor device 100B, there is a distance D2 between the topmost surface of the splash structure S2 and the top surface 133'T of the metal oxide layer 133' close to the first dielectric layer 105. In some embodiments, the distance D1 is greater than the distance D2.

Figure 3:
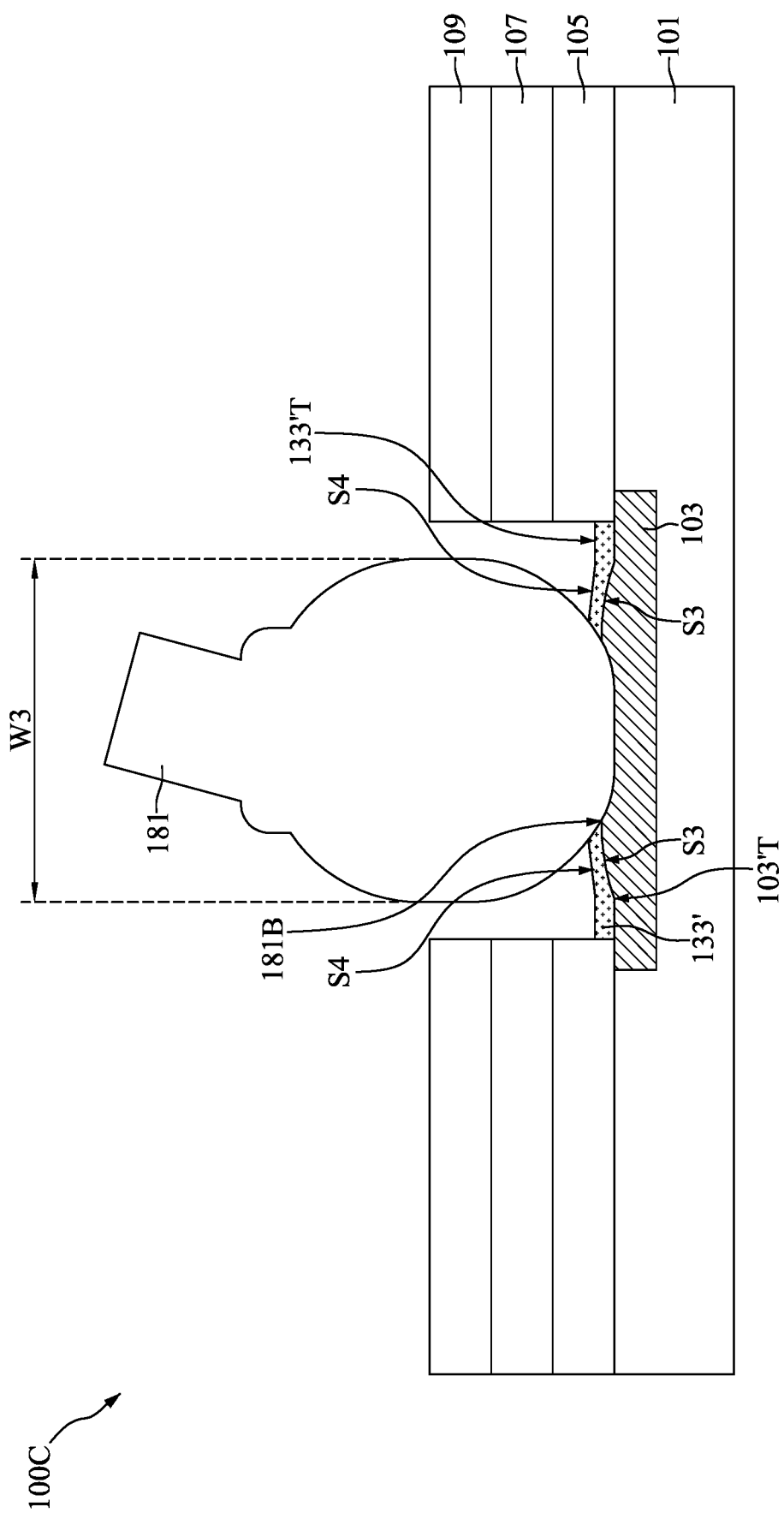
FIG. 3 is a cross-sectional view illustrating a semiconductor device, in accordance with some embodiments.

FIG. 3 is a cross-sectional view illustrating a semiconductor device 100C, in accordance with some embodiments. Semiconductor device 100C may be similar to the semiconductor device 100A, where same reference numbers refer to the same elements, and certain details or descriptions of the same elements are not repeated. Some differences are noted below. In the semiconductor device 100C, there is no polymer layer sandwiched between the wire bond 181 and the dielectric stack.

Moreover, in the semiconductor device 100C, the bonding pad 103' includes a splash structure S3 protruding from the top surface 103'T of the bonding pad 103', the metal oxide layer 133' includes a splash structure S4 protruding from the top surface 133'T of the metal oxide layer 133', and the bottom surface 181B of the wire bond 181 is surrounded by and in direct contact with the splash structures S3 and S4, in accordance with some embodiments. In some embodiments, the bottom surface 181B of the wire bond 181 is located below the top surface 103'T of the bonding pad 103'.

Figure 4:
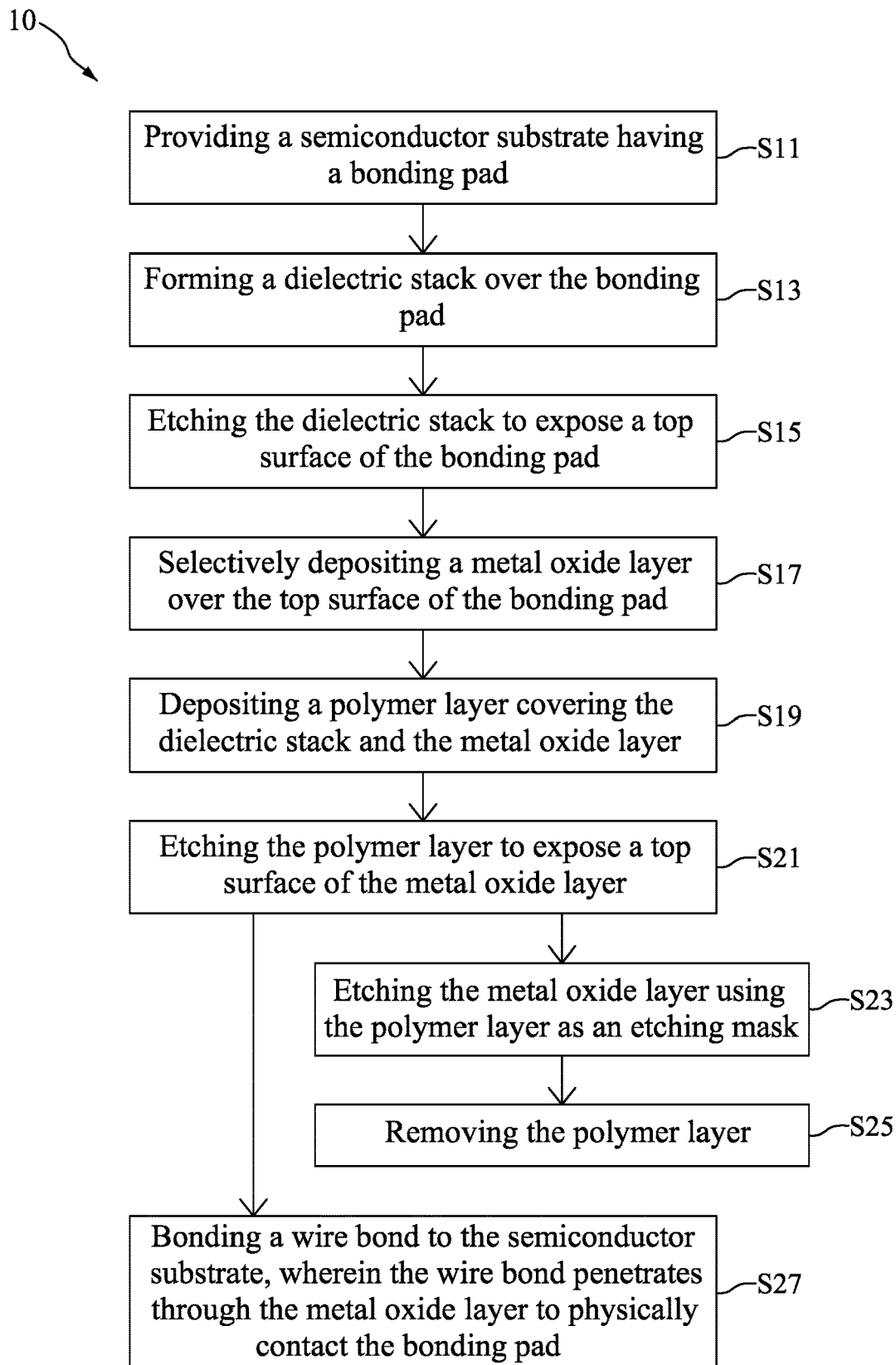
FIG. 4 is a flow diagram illustrating a method for forming a semiconductor device, in accordance with some embodiments.

FIG. 4 is a flow diagram illustrating a method 10 for forming a semiconductor device (e.g., the semiconductor devices 100A, 100B, and 100C), and the method 10 includes steps S11, S13, S15, S17, S19, S21, S23, S25, and S27, in accordance with some embodiments. The steps S11 to S27 of FIG. 4 are elaborated in connection with the following figures.

FIGS. 5 to 14 illustrate intermediated stages of preparing the semiconductor device 100A, in accordance with some embodiments.

Figure 5:
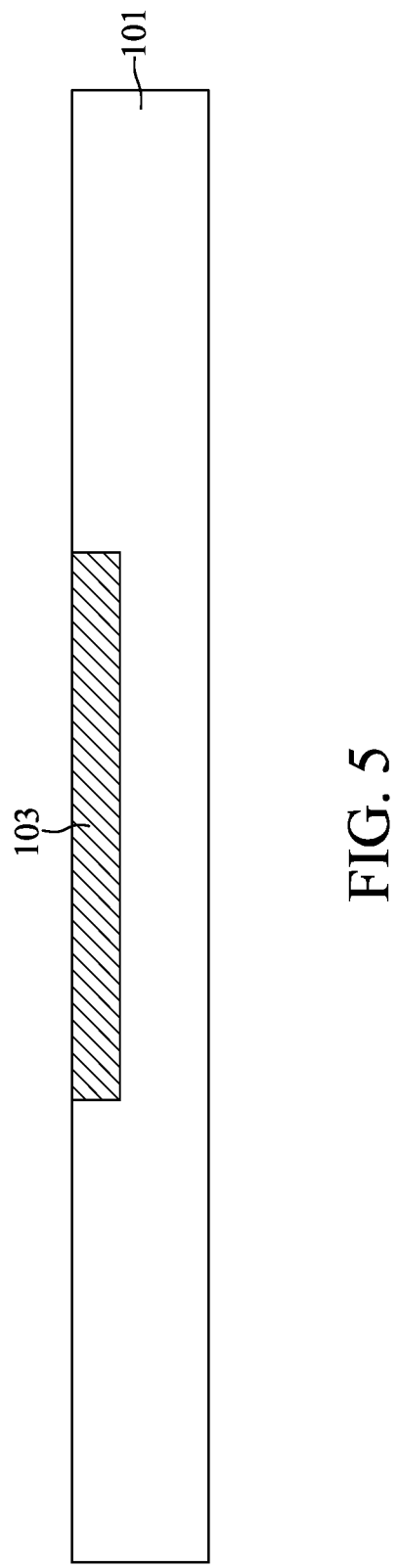
FIG. 5 is a cross-sectional view illustrating an intermediate stage of providing a semiconductor substrate having a bonding pad during the formation of a semiconductor device, in accordance with some embodiments.

As shown in FIG. 5, the semiconductor substrate 101 having the bonding pad 103 is provided. The respective step is illustrated as the step S11 in the method 10 shown in FIG. 4.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

The semiconductor substrate 101 may include various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable integrated circuit (IC) components, or combinations thereof.

Moreover, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). For example, the bonding pad 103 is electrically connected to the conductive layers within the semiconductor substrate 101. The semiconductor substrate 101 has been simplified for the sake of clarity. It should be noted that additional features can be added in the semiconductor substrate 101, and some of the features described below can be replaced, modified, or eliminated in other embodiments.

In some embodiments, the bonding pad 103 includes copper (Cu) or another suitable conductive material. In addition, the semiconductor substrate 101 has more than one bonding pad, and the materials of these bonding pads include copper (Cu), in accordance with some embodiments.

Figure 6:
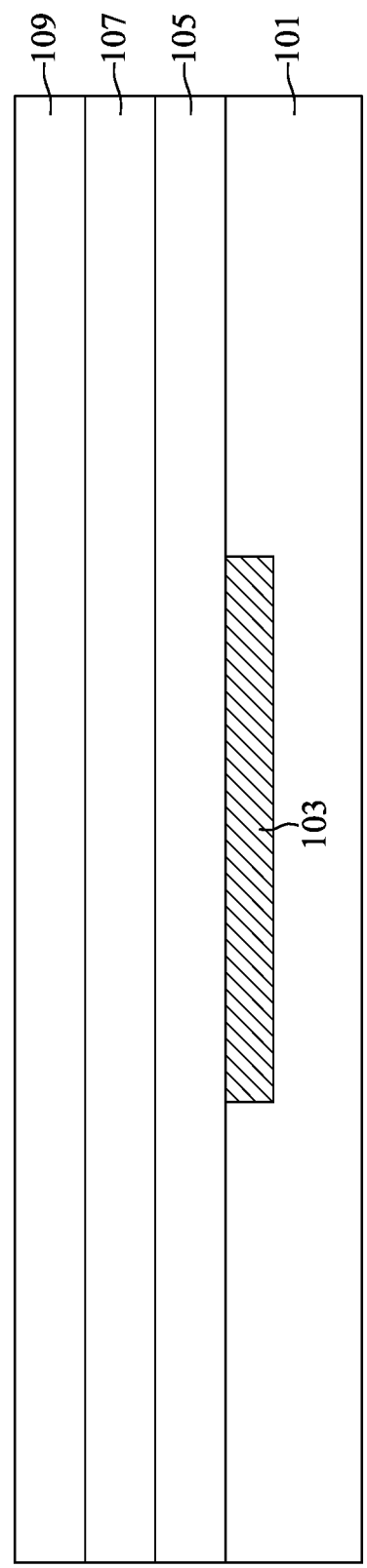
FIG. 6 is a cross-sectional view illustrating an intermediate stage of forming a dielectric stack over the semiconductor substrate and the bonding pad during the formation of the semiconductor device, in accordance with some embodiments.

Next, the dielectric stack is formed over the semiconductor substrate 101, as shown in FIG. 6 in accordance with some embodiments. In some embodiments, the first dielectric layer 105, the second dielectric layer 107, and the third dielectric layer 109 are sequentially formed over the semiconductor substrate 101, and the bonding pad 103 is covered by the dielectric stack. The respective step is illustrated as the step S13 in the method 10 shown in FIG. 4.

The materials of the first dielectric layer 105, the second dielectric layer 107, and the third dielectric layer 109 may include silicon oxide, silicon nitride, silicon oxynitride, other suitable materials, and/or combinations thereof. In some embodiments, the first dielectric layer 105 and the second dielectric layer 107 are made of different materials. For example, one of the first dielectric layer 105 and the second dielectric layer 107 has a tensile stress, and the other one of the first dielectric layer 105 and the second dielectric layer 107 has a compressive stress, thereby creating zero stress or near zero stress between them.

In addition, the first dielectric layer 105, the second dielectric layer 107, and the third dielectric layer 109 may be formed by deposition processes. The deposition processes may include chemical vapor deposition (CVD), physical vapor deposition (PVD), atomic layer deposition (ALD), other suitable methods, and/or combinations thereof.

Figure 7:
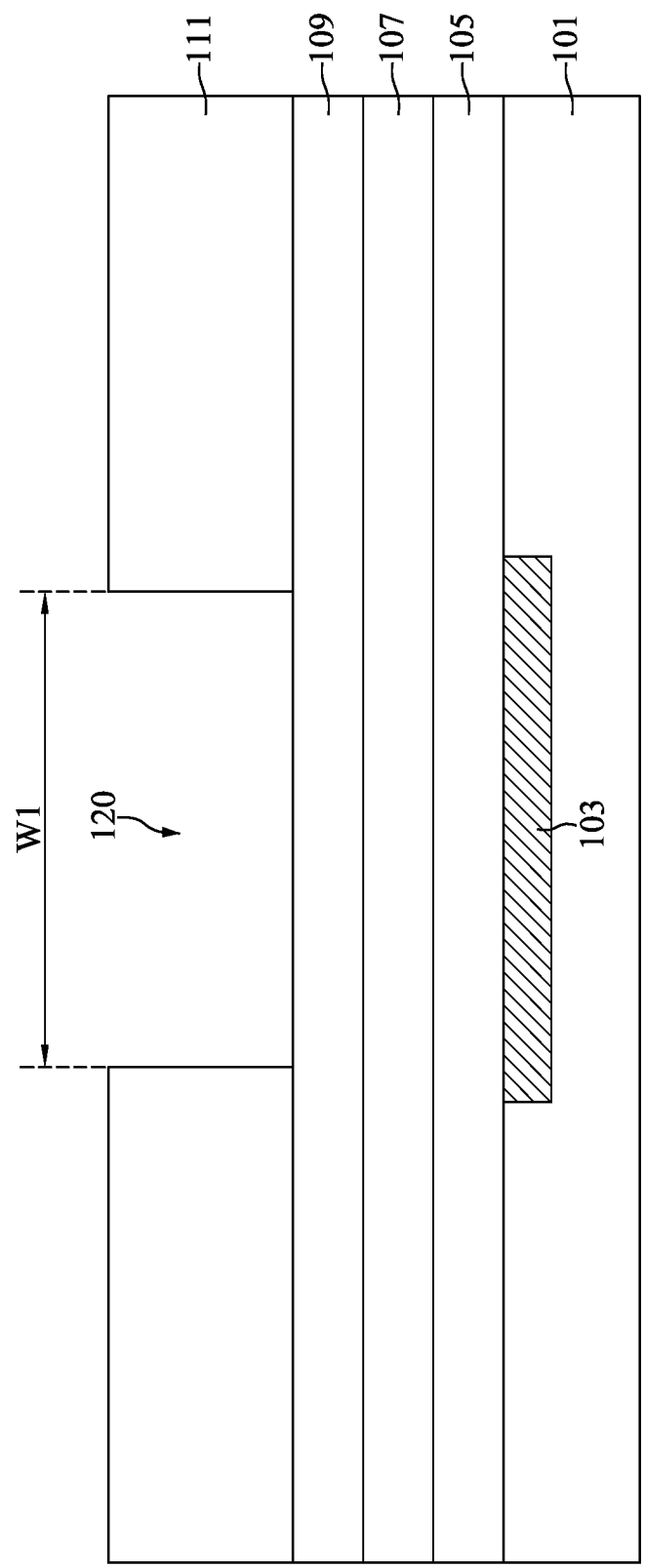
FIG. 7 is a cross-sectional view illustrating an intermediate stage of forming a patterned mask over the dielectric stack during the formation of the semiconductor device, in accordance with some embodiments.

Then, a patterned mask 111 with an opening 120 is formed over the dielectric stack, as shown in FIG. 7 in accordance with some embodiments. In some embodiments, the opening 120 of the patterned mask 111 exposes a top surface of the third dielectric layer 109. In some embodiments, the opening 120 of the patterned mask 111 has a width W1.

Figure 8:
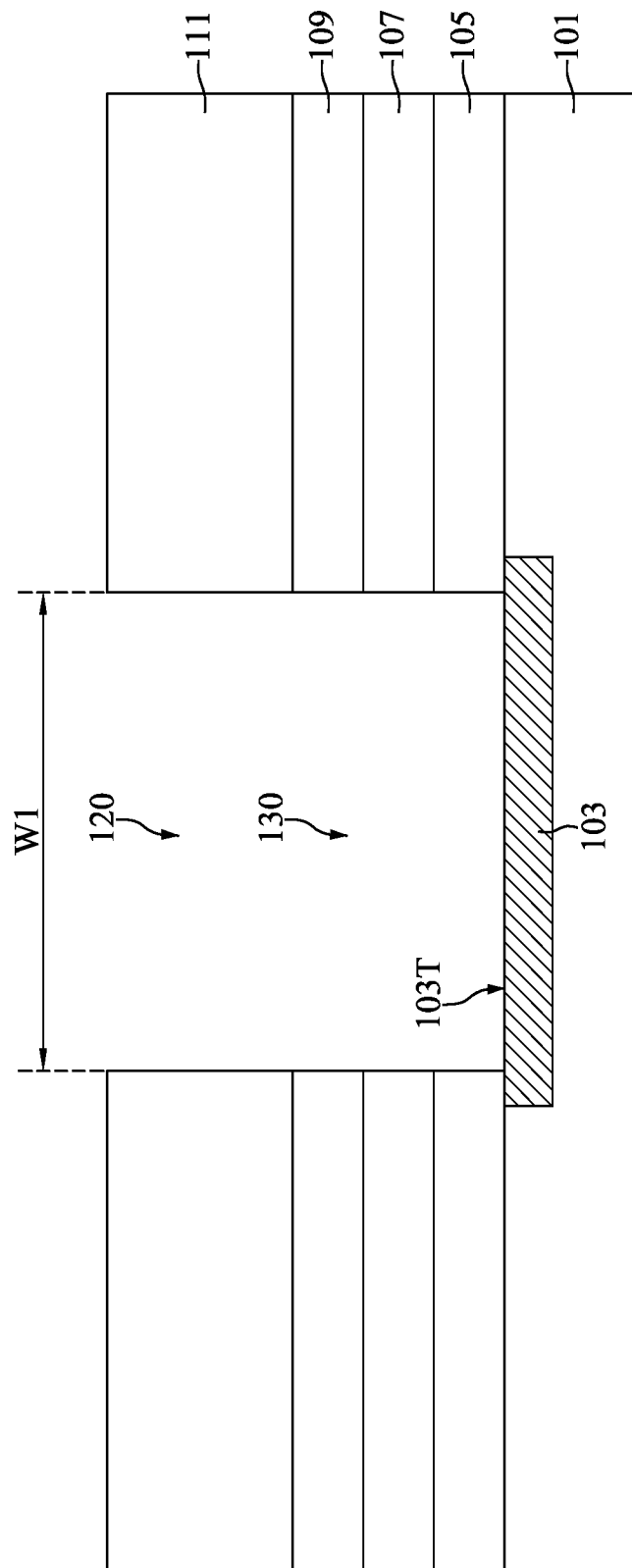
FIG. 8 is a cross-sectional view illustrating an intermediate stage of etching the dielectric stack using the patterned mask as an etching mask to expose a top surface of the bonding pad during the formation of the semiconductor device, in accordance with some embodiments.

Subsequently, the dielectric stack is etched using the patterned mask 111 as an etching mask, such that an opening 130 is formed in the dielectric stack, as shown in FIG. 8 in accordance with some embodiments. In some embodiments, the top surface 103T of the bonding pad 103 is at least partially exposed by the opening 130. The respective step is illustrated as the step S15 in the method 10 shown in FIG. 4.

In some embodiments, the etching process performed on the dielectric stack includes a dry etching process, a wet etching process, or a combination thereof. After the etching process, the first dielectric layer 105, the second dielectric layer 107, and the third dielectric layer 109 have substantially aligned sidewalls (i.e., the sidewalls of the opening 130).

Moreover, in some embodiments, the width of the opening 130 is substantially equals to the width W1. After the top surface 103T of the bonding pad 103 is exposed by the opening 130, the patterned mask 111 may be removed. In some embodiments, the patterned mask 111 is removed by a stripping process, an ashing process, an etching process, or another suitable process.

Figure 9:
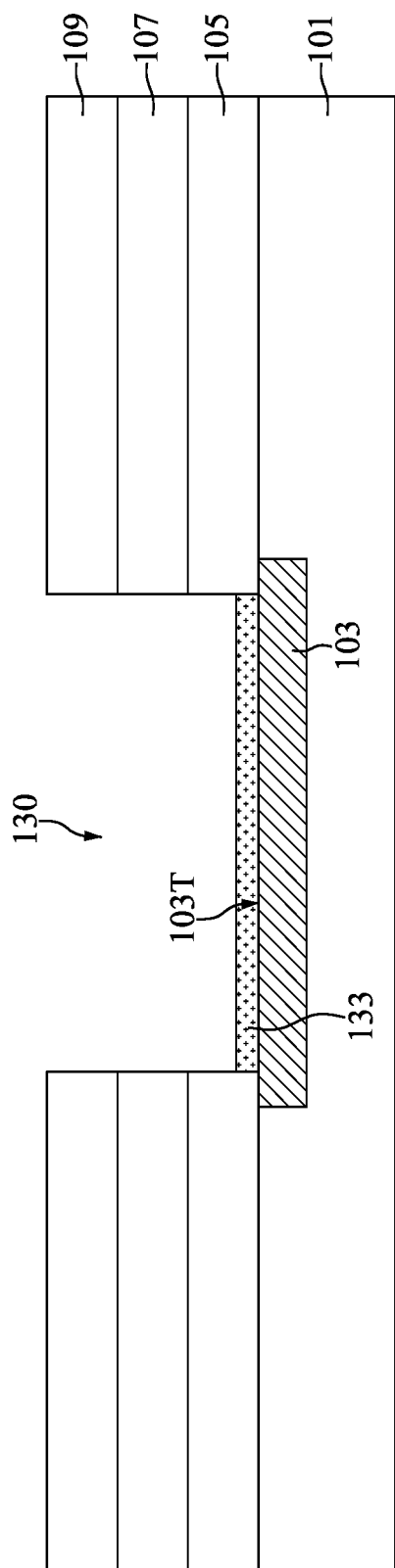
FIG. 9 is a cross-sectional view illustrating an intermediate stage of selectively depositing a metal oxide layer over the top surface of the bonding pad during the formation of the semiconductor device, in accordance with some embodiments.

Next, the metal oxide layer 133 is selectively deposited over the top surface 103T of the bonding pad 103, as shown in FIG. 9 in accordance with some embodiments. The respective step is illustrated as the step S17 in the method 10 shown in FIG. 4. In some embodiments, the metal oxide layer 133 is selectively deposited by an ALD process. It should be noted that the sidewalls of the dielectric stack are exposed after the metal oxide layer 133 is selectively deposited. That is, the sidewalls of the dielectric stack are not covered by the metal oxide layer 133.

In some embodiments, during the selective deposition process, the structure of FIG. 8 (with or without the patterned mask 111) is exposed separately to a metal precursor and an alcohol. In some embodiments, the metal precursor includes tantalum (Ta), titanium (Ti), aluminum (Al), hafnium (Hf), zirconium (Zr), nickel (Ni), zinc (Zn), or a combination thereof. In some embodiments, the alcohol includes methanol, ethanol, isopropanol, t-butanol, or a combination thereof. It should be noted that the thickness of the metal oxide layer 133 is relatively small that the sidewalls of the first dielectric layer 105 is substantially not covered by the metal oxide layer 133.

Figure 10:
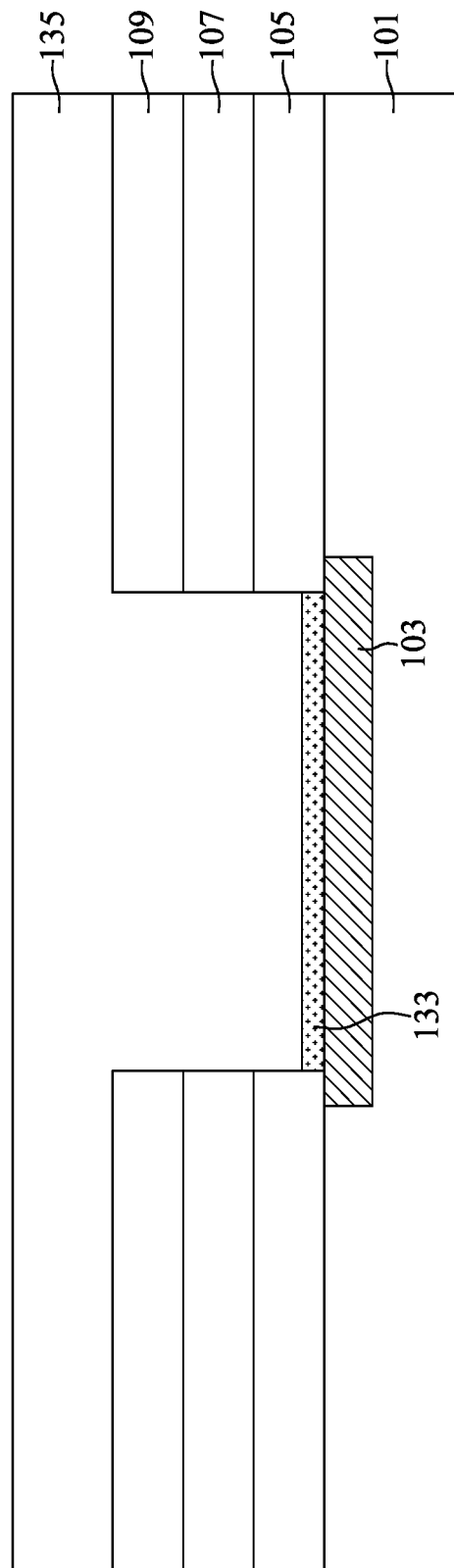
FIG. 10 is a cross-sectional view illustrating an intermediate stage of depositing a polymer layer covering the dielectric stack and the metal oxide layer during the formation of the semiconductor device, in accordance with some embodiments.

Then, the polymer layer 135 is deposited covering the dielectric stack and the metal oxide layer 113, as shown in FIG. 10 in accordance with some embodiments. The respective step is illustrated as the step S19 in the method 10 shown in FIG. 4. In some embodiments, the polymer layer 135 is formed covering the top surface and the sidewalls of the third dielectric layer 109, the sidewalls of the second dielectric layer 107, and the sidewalls of the first dielectric layer 105.

In some embodiments, the opening 130 (see FIG. 9) is filled by the polymer 135. In some embodiments, the polymer layer 135 includes polyimide. In addition, the polymer layer 135 may be formed by a deposition process, such as a CVD process, a PVD process, an ALD process, or another suitable deposition process.

Figure 11:
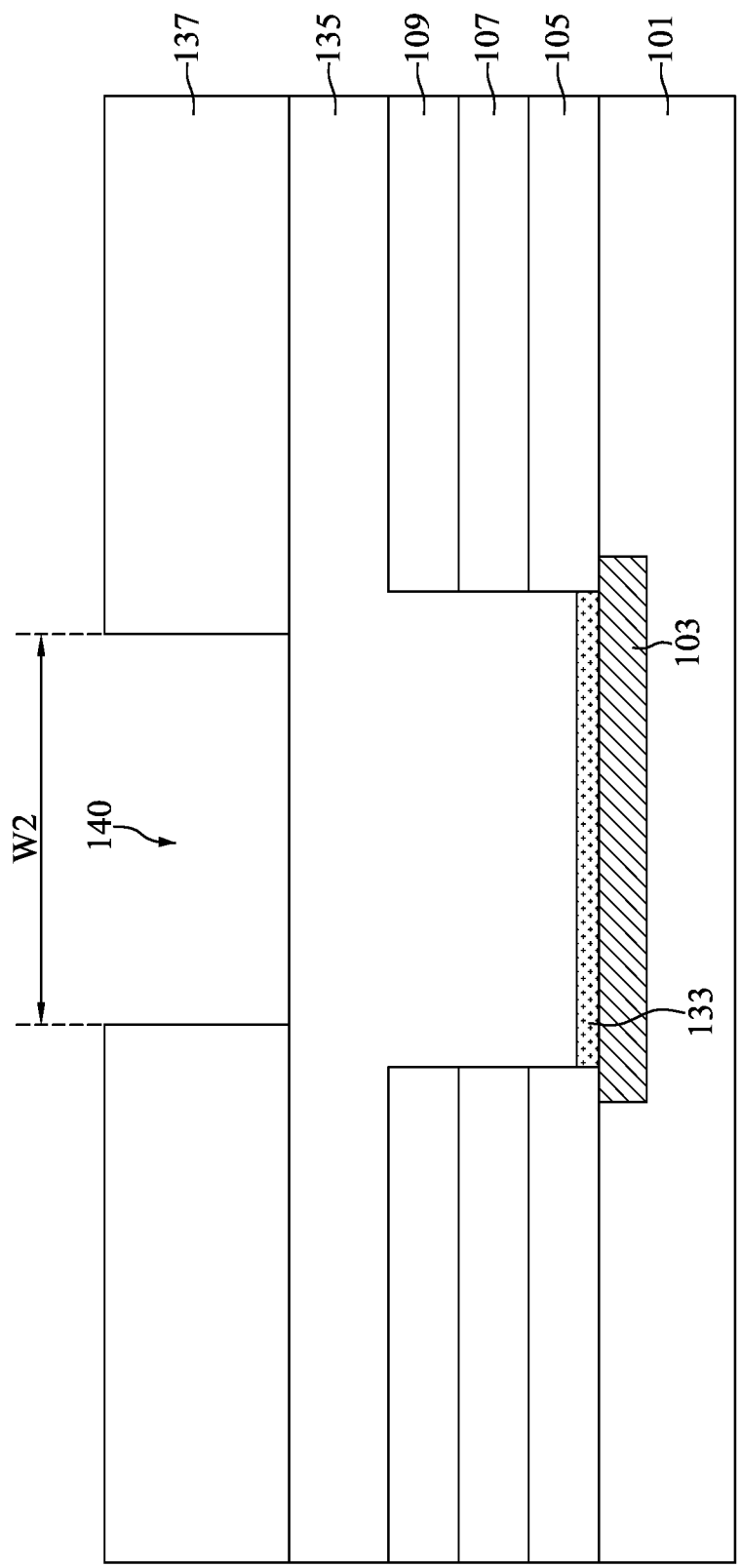
FIG. 11 is a cross-sectional view illustrating an intermediate stage of forming a patterned mask over the polymer layer during the formation of the semiconductor device, in accordance with some embodiments.

Subsequently, a patterned mask 137 with an opening 140 is formed over the polymer layer 135, as shown in FIG. 11 in accordance with some embodiments. In some embodiments, the opening 140 of the patterned mask 137 exposes a top surface of the polymer layer 135. In some embodiments, the opening 140 of the patterned mask 137 has a width W2.

Figure 12:
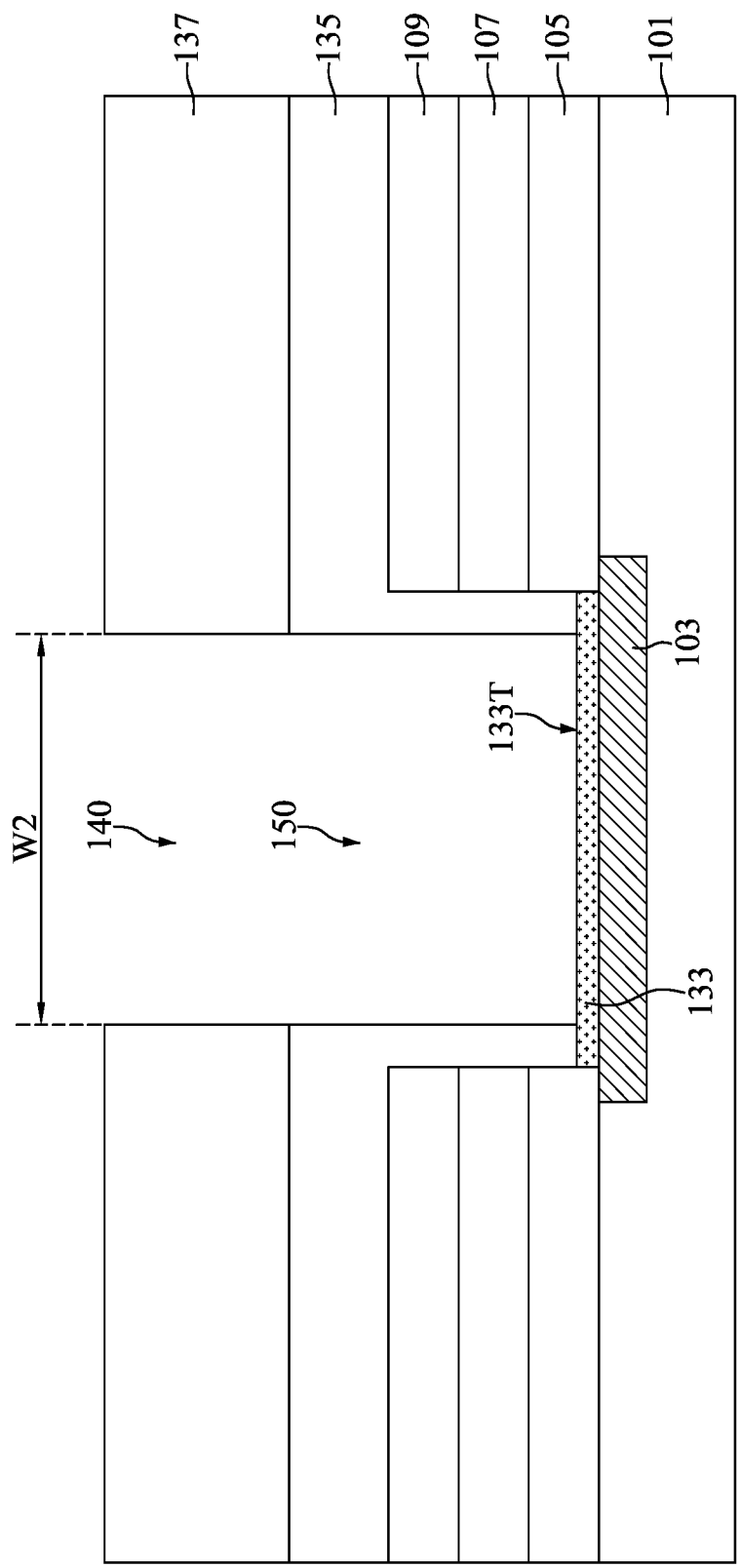
FIG. 12 is a cross-sectional view illustrating an intermediate stage of etching the polymer layer using the patterned mask as an etching mask to expose a top surface of the metal oxide layer during the formation of the semiconductor device, in accordance with some embodiments.

Next, the polymer layer 135 is etched using the patterned mask 137 as an etching mask, such that an opening 150 is formed in the polymer layer 135, as shown in FIG. 12 in accordance with some embodiments. In some embodiments, the top surface 133T of the metal oxide layer 133 is partially exposed by the opening 150. The respective step is illustrated as the step S21 in the method 10 shown in FIG. 4.

In some embodiments, the etching process performed on the polymer layer 135 includes a dry etching process, a wet etching process, or a combination thereof. After the etching process, the top surface and the sidewalls of the dielectric stack are entirely covered by the polymer layer 135, and a portion of the metal oxide layer 133 is covered by the polymer layer 135, in accordance with some embodiments. Moreover, in some embodiments, the width of the opening 150 is substantially equals to the width W2.

Figure 13:
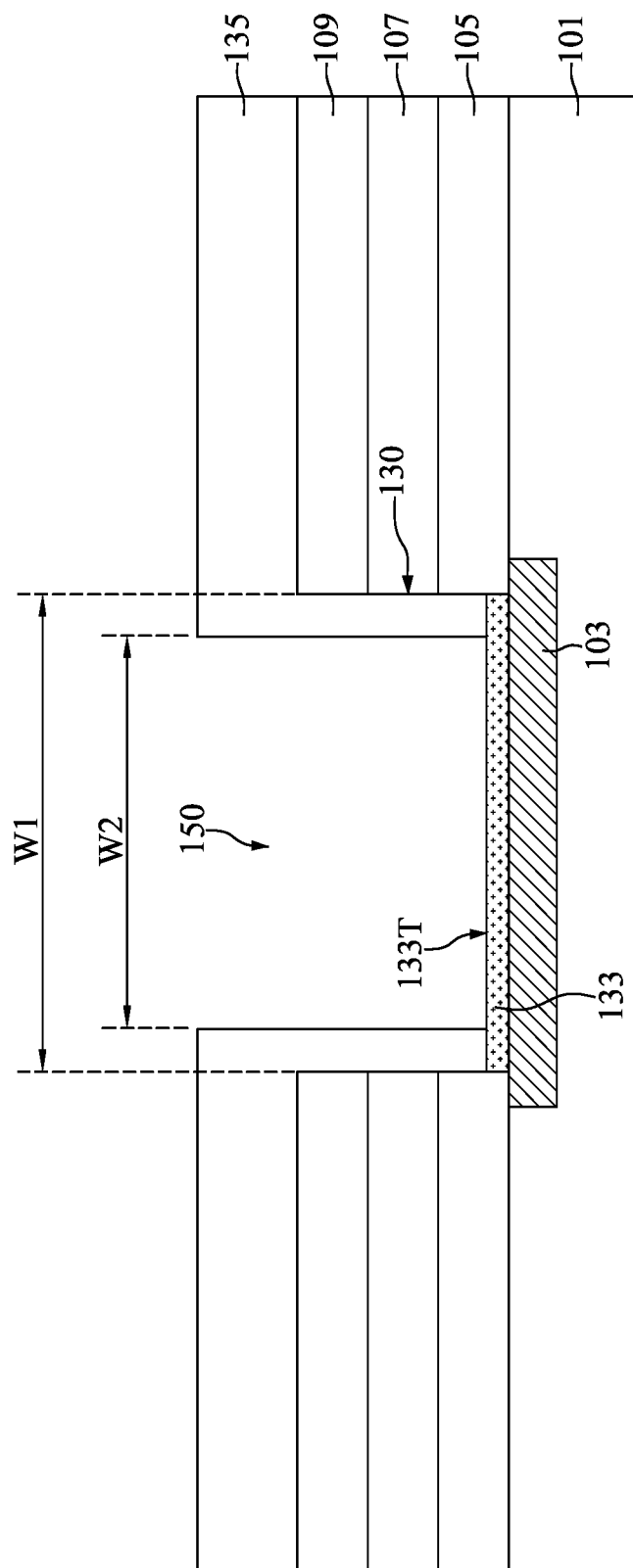
FIG. 13 is a cross-sectional view illustrating an intermediate stage of removing the patterned mask during the formation of the semiconductor device, in accordance with some embodiments.

After the top surface 133T of the metal oxide layer 133 is exposed by the opening 150, the patterned mask 137 is removed, as shown in FIG. 13 in accordance with some embodiments. In some embodiments, the patterned mask 137 is removed by a stripping process, an ashing process, an etching process, or another suitable process. In some embodiments, the width W2 of the opening 150 in the polymer layer 135 is less than the width W1 of the opening 130 in the dielectric stack.

Figure 14:
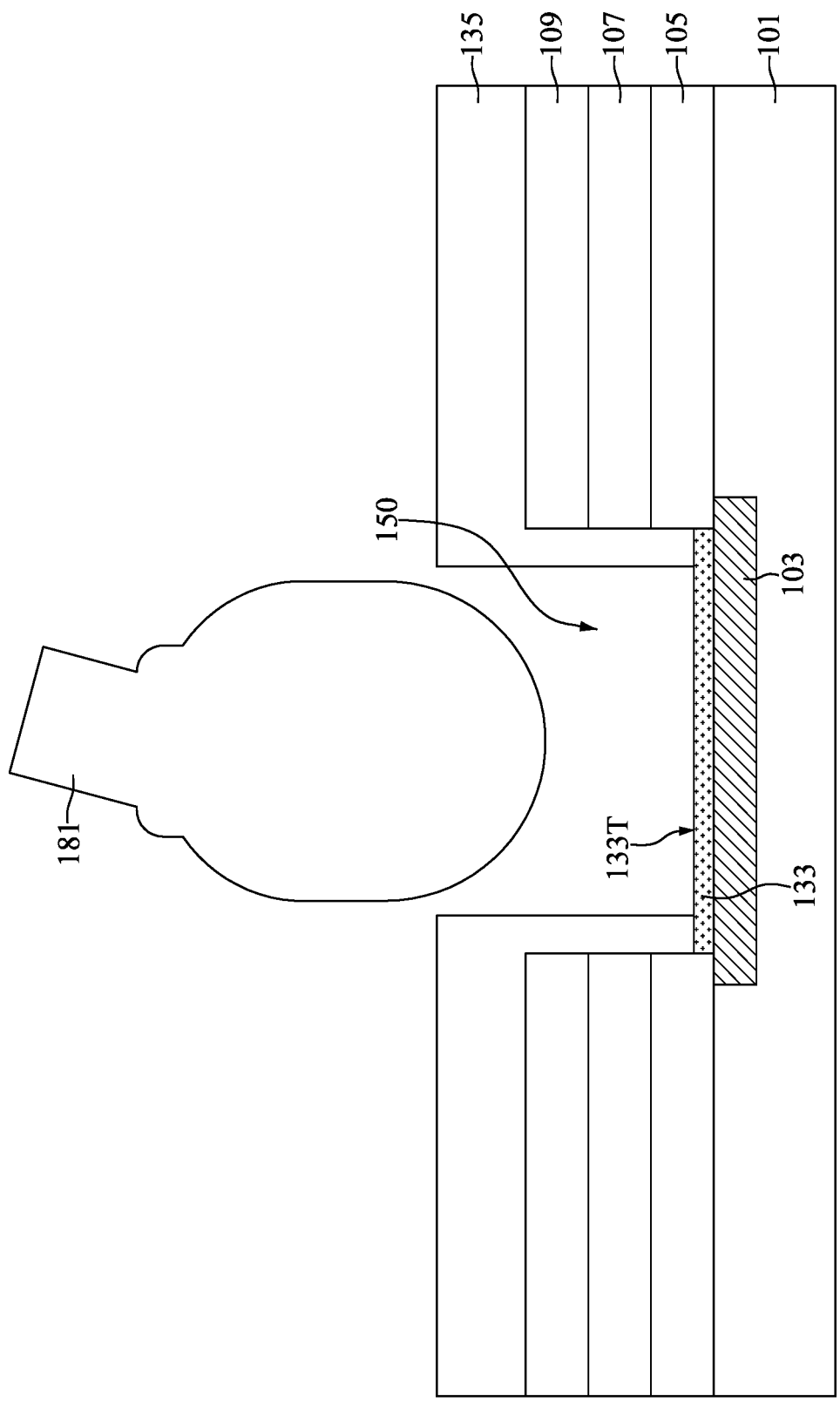
FIG. 14 is a cross-sectional view illustrating an intermediate stage of aligning a wire bond to the bonding pad during the formation of the semiconductor device, in accordance with some embodiments.

After the patterned mask 137 is removed, the wire bond 181 is aligned to the opening 150 exposing the top surface 133T of the metal oxide layer 133, as shown in FIG. 14 in accordance with some embodiments. In some embodiments, the wire bond 253 includes copper (Cu), tungsten (W), or another suitable material. In some embodiments, the wire bond 253 is bonded to the semiconductor substrate 101 by applying a downward force.

Then, the wire bond 181 is bonded to the semiconductor substrate 101, as shown in FIG. 1 in accordance with some embodiments. In some embodiments, the wire bond 181 penetrates through the metal oxide layer 133 to physically contact the bonding pad 103. The respective step is illustrated as the step S27 in the method 10 shown in FIG. 4. After the wire bond 181 is bonded to the bonding pad 103, the semiconductor device 100A is obtained.

As mentioned above, the splash structure S1 is formed around the wire bond 181 and in the opening 150 (see FIG. 14) during the bonding process. In some embodiments, the splash structure S1 is formed from the material of the metal oxide layer 133, and the bottom surface 181B of the wire bond 181 is surrounded by and in direct contact with the splash structure S1. In some embodiments, the splash structure S1 of the metal oxide layer 133 and the wire bond 181 have a gap between them.

In the semiconductor device 100A, the bonding pad 103 is entirely covered by the metal oxide layer 133 and the wire bond 181 after the bonding process. That is, the bonding pad 103 is not exposed to the air. This protects the bonding pad 103 from oxidation and contamination, and the metal oxide layer 133 can provide mechanical support to the wire bond 181. Moreover, the material of the metal oxide layer 133 is selected such that it can be used for preventing ion migration from the bonding pad 103 into adjacent regions. In addition, the metal oxide layer 133 is selectively deposited over the bonding pad 103 without performing an oxidation process, which prevents detrimental impact on device performance. As a result, the performance of the semiconductor device 100A can be enhanced.

Figure 15:
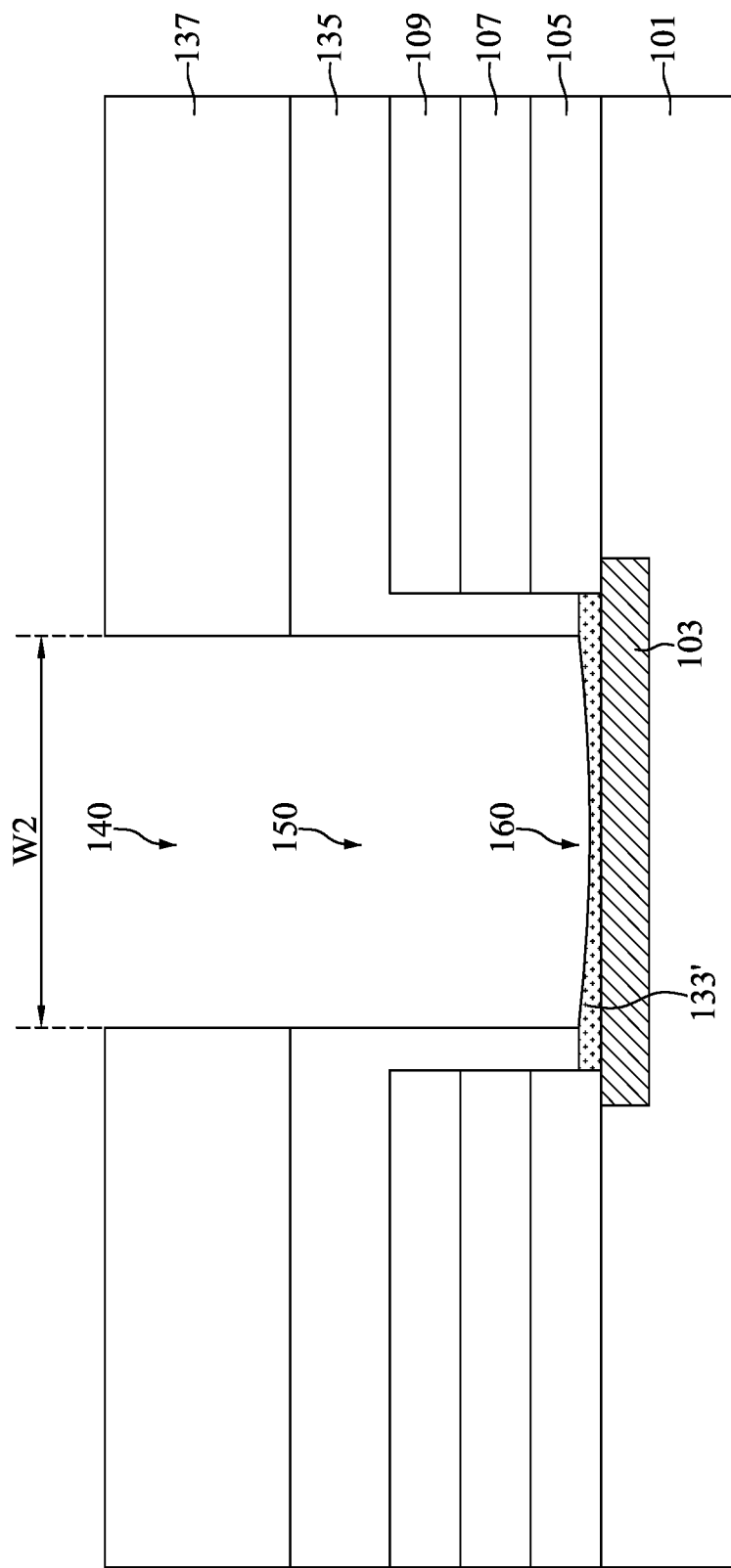
FIG. 15 is a cross-sectional view illustrating an intermediate stage of etching the metal oxide layer using the patterned mask as an etching mask to form a recess in the metal oxide layer during the formation of the semiconductor device, in accordance with some embodiments.
Figure 16:
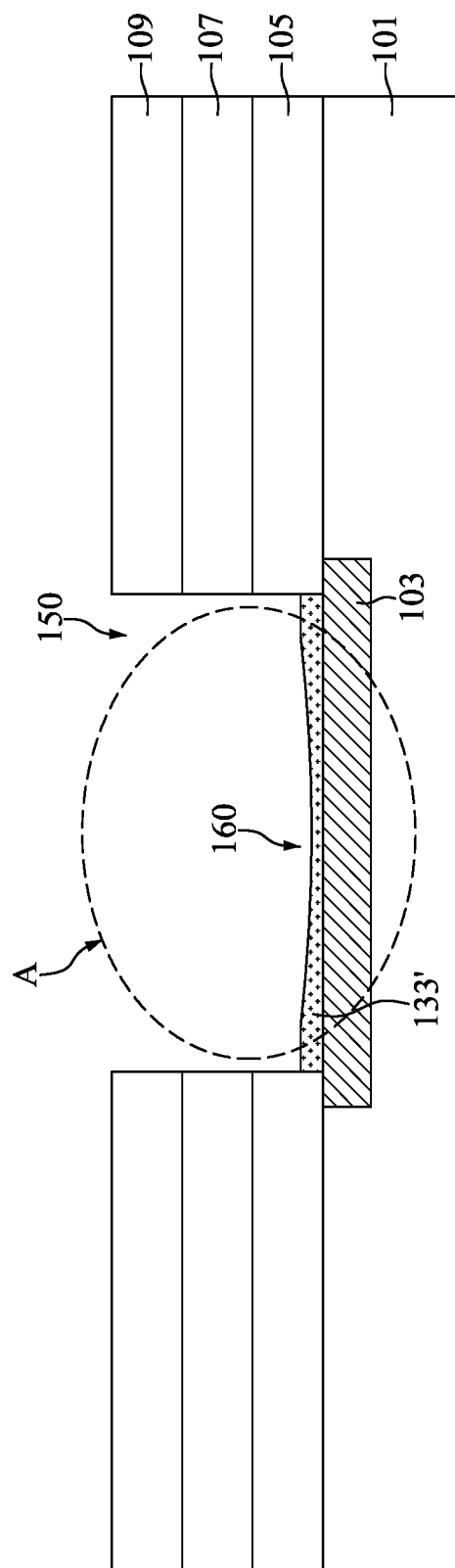
FIG. 16 is a cross-sectional view illustrating an intermediate stage of removing the patterned mask and the polymer layer during the formation of the semiconductor device, in accordance with some embodiments.

FIGS. 15 to 16 illustrate intermediated stages of preparing the semiconductor device 100B continued from the structure shown in FIG. 12, in accordance with some embodiments. After the polymer layer 135 is etched, the metal oxide layer 133 is etched using the patterned mask 137 as an etching mask, such that a recess 160 is formed in the recessed metal oxide layer 133', as shown in FIG. 15 in accordance with some embodiments. The respective step is illustrated as the step S23 in the method 10 shown in FIG. 4.

In some embodiments, the etching process performed on the metal oxide layer 133 includes a dry etching process, a wet etching process, or a combination thereof. After the etching process, the bonding pad 103 remains covered by the recessed metal oxide layer 133', in accordance with some embodiments. Moreover, in some embodiments, the width of the recess 160 is substantially equals to the width W2.

Figure 17:
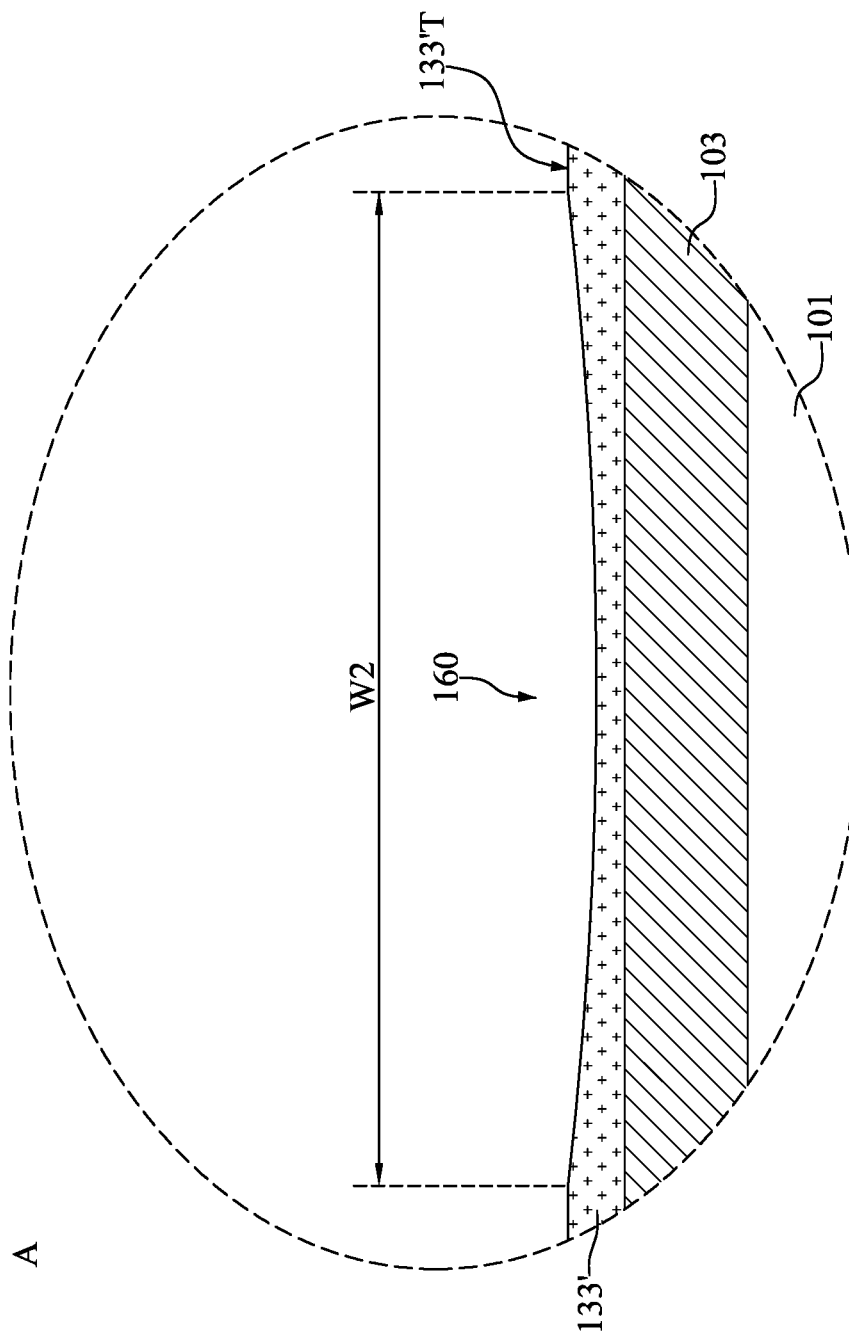
FIG. 17 is a partial enlargement view illustrating a portion of the structure shown in FIG. 16, in accordance with some embodiments.

After the recessed metal oxide layer 133' is formed, the patterned mask 137 and the polymer layer 135 are removed, as shown in FIG. 16 in accordance with some embodiments. FIG. 17 is a partial enlargement view illustrating the portion A of the structure shown in FIG. 16, in accordance with some embodiments. The respective step is illustrated as the step S25 in the method 10 shown in FIG. 4.

Some processes used to remove the polymer layer 135 are similar to, or the same as those used to remove the patterned mask 137, and details thereof are not repeated herein. After the polymer layer 135 is removed, the top surface 133'T of the metal oxide layer 133' is entirely exposed by the opening 150 and the recess 160, in accordance with some embodiments.

Subsequently, the wire bond 181 is bonded to the semiconductor substrate 101, as shown in FIG. 2 in accordance with some embodiments. In some embodiments, the wire bond 181 penetrates through the metal oxide layer 133' to physically contact the bonding pad 103. The respective step is illustrated as the step S27 in the method 10 shown in FIG. 4.

After the wire bond 181 is bonded to the bonding pad 103, the semiconductor device 100B is obtained. In some embodiments, the wire bond 181 has a maximum width W3, and the maximum width W3 is less than or substantially equal to the width W2 of the recess 160 (see FIG. 17).

As mentioned above, the splash structure S2 is formed around the wire bond 181 and in the opening 150 and the recess 160 (see FIG. 16) during the bonding process. In some embodiments, the splash structure S2 is formed from the material of the metal oxide layer 133', and the bottom surface 181B of the wire bond 181 is surrounded by and in direct contact with the splash structure S2.

In some embodiments, since the metal oxide layer 133 is etched to form the recessed metal oxide layer 133' with the recess 160 before the bonding process, which reserves capacity for the splash structure S2 formed during the bonding process, the distance D2 of FIG. 2 is less the distance D1 of FIG. 1. As a result, undesired electrical connection between adjacent bonding pads can be prevented.

Figure 18:
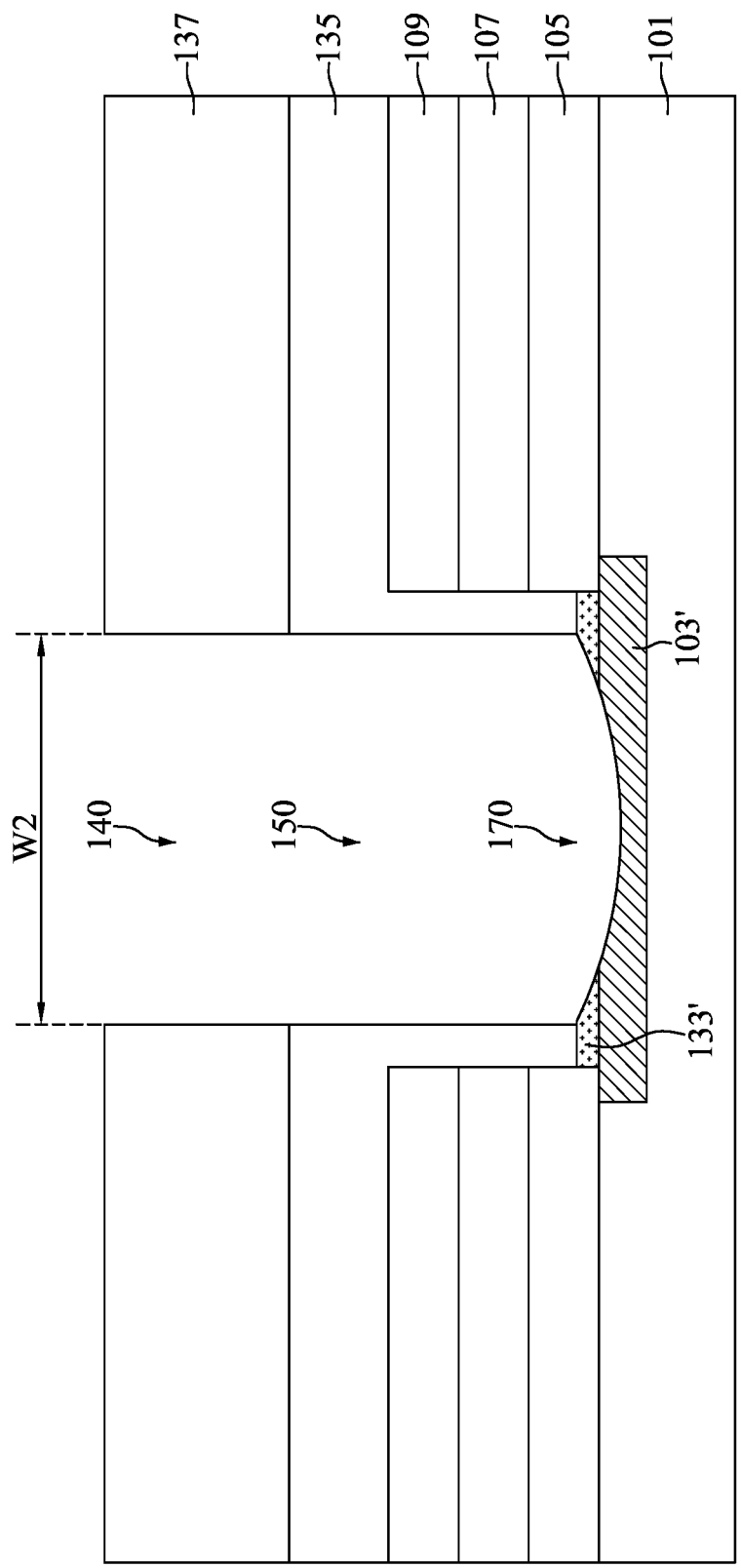
FIG. 18 is a cross-sectional view illustrating an intermediate stage of etching the metal oxide layer and the bonding pad using the patterned mask as an etching mask to form a recess in the metal oxide layer and the bonding pad during the formation of the semiconductor device, in accordance with some embodiments.
Figure 19:
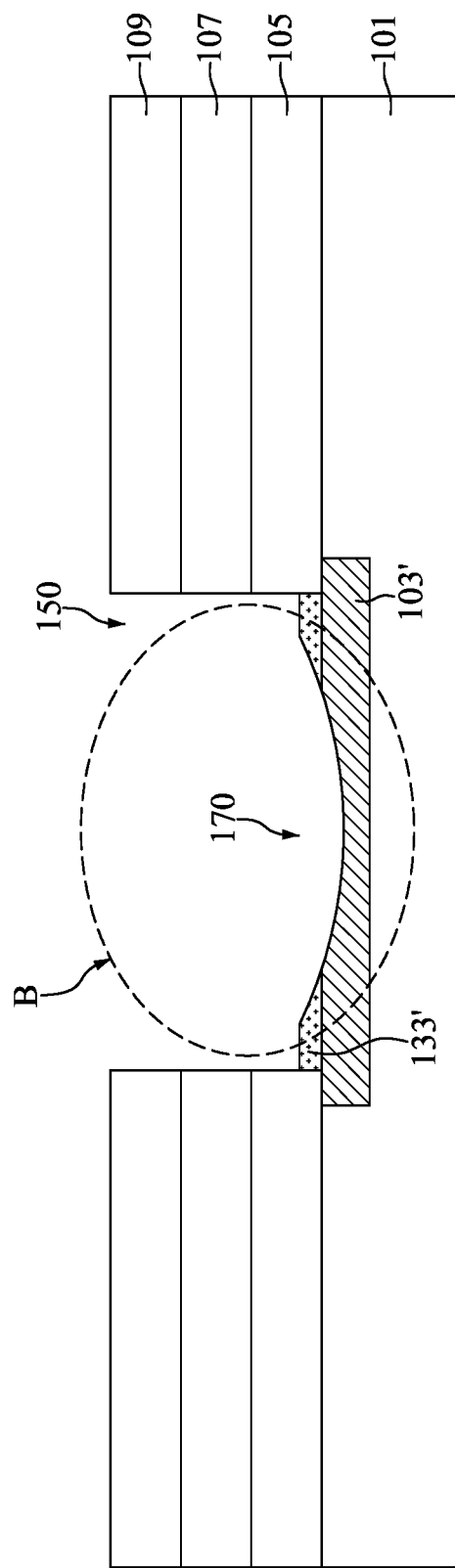
FIG. 19 is a cross-sectional view illustrating an intermediate stage of removing the patterned mask and the polymer layer during the formation of the semiconductor device, in accordance with some embodiments.

FIGS. 18 to 19 illustrate intermediated stages of preparing the semiconductor device 100C continued from the structure shown in FIG. 12, in accordance with some embodiments. After the polymer layer 135 is etched, the metal oxide layer 133 and the bonding pad 103 are etched using the patterned mask 137 as an etching mask, such that a recess 170 is formed in the recessed metal oxide layer 133' and the recessed bonding pad 103', as shown in FIG. 18 in accordance with some embodiments. The respective step is illustrated as the step S23 in the method 10 shown in FIG. 4.

In some embodiments, the etching process performed on the metal oxide layer 133 and the bonding pad 103 includes a dry etching process, a wet etching process, or a combination thereof. In some embodiments, the recess 170 penetrates through the metal oxide layer 133', and the bonding pad 103 is exposed. Moreover, in some embodiments, the width of the recess 170 is substantially equals to the width W2.

Figure 20:
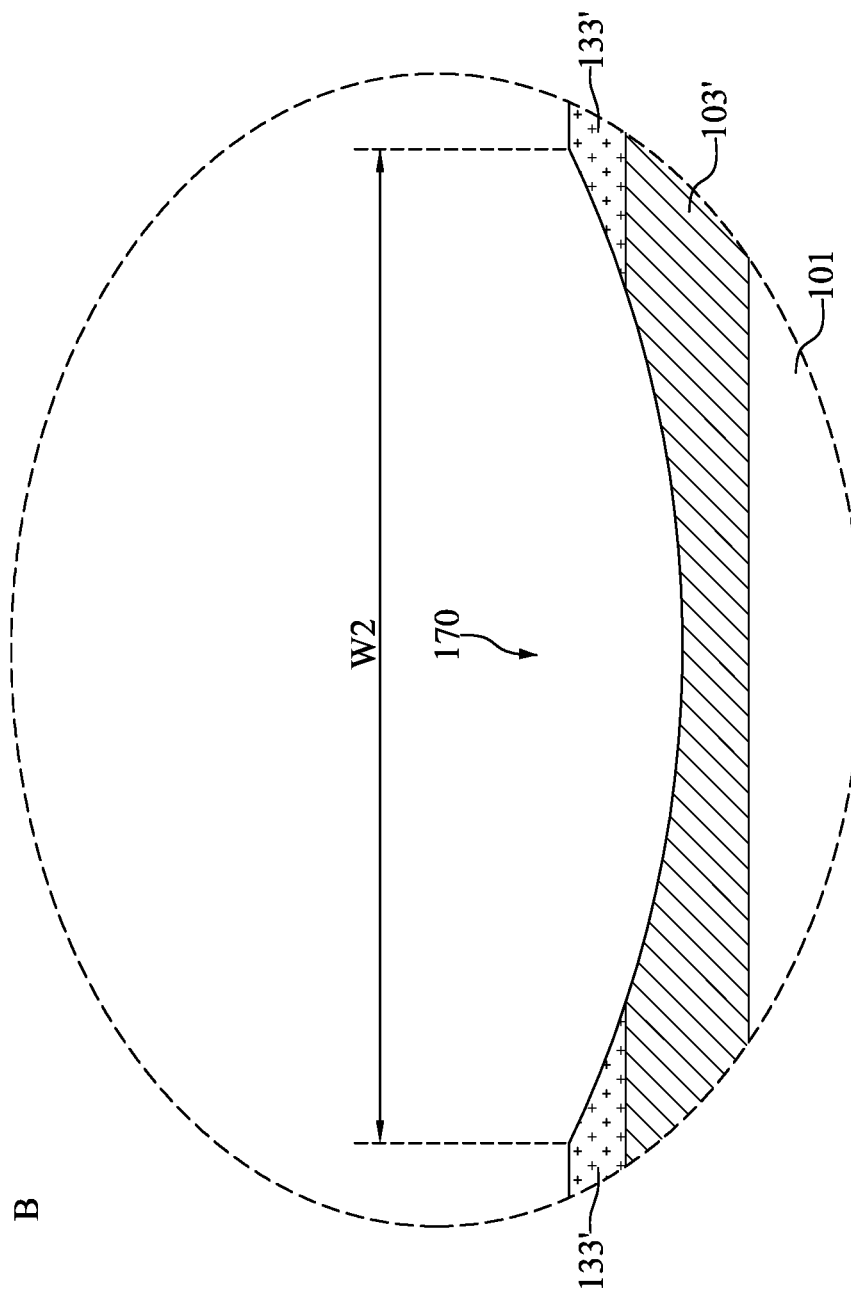
FIG. 20 is a partial enlargement view illustrating a portion of the structure shown in FIG. 19, in accordance with some embodiments.

After the recessed metal oxide layer 133' and the recessed bonding pad 103' are formed, the patterned mask 137 and the polymer layer 135 are removed, as shown in FIG. 19 in accordance with some embodiments. FIG. 20 is a partial enlargement view illustrating the portion B of the structure shown in FIG. 19, in accordance with some embodiments. The respective step is illustrated as the step S25 in the method 10 shown in FIG. 4. After the polymer layer 135 is removed, the top surface 133'T of the metal oxide layer 133' is entirely exposed by the opening 150 and the recess 170, in accordance with some embodiments.

Next, the wire bond 181 is bonded to the semiconductor substrate 101, as shown in FIG. 3 in accordance with some embodiments. In some embodiments, the wire bond 181 physically contacts the metal oxide layer 133' and the bonding pad 103'. The respective step is illustrated as the step S27 in the method 10 shown in FIG. 4.

After the wire bond 181 is bonded to the bonding pad 103', the semiconductor device 100C is obtained. In some embodiments, the wire bond 181 has a maximum width W3, and the maximum width W3 is less than or substantially equal to the width W2 of the recess 170 (see FIG. 20).

As mentioned above, the splash structures S3 and S4 are formed around the wire bond 181 and in the opening 150 and the recess 170 (see FIG. 19) during the bonding process. In some embodiments, the splash structure S3 is formed from the material of the metal oxide layer 133', the splash structure S4 is formed from the material of the bonding pad 103', and the bottom surface 181B of the wire bond 181 is surrounded by and in direct contact with the splash structures S3 and S4.

In some embodiments, since the metal oxide layer 133 and the bonding pad 103 are etched to form the recessed metal oxide layer 133' and the recessed bonding pad 103' with the recess 170 before the bonding process, which reserves capacity for the splash structures S3 and S4 formed during the bonding process, undesired electrical connection between adjacent bonding pads can be prevented.

Embodiments of a semiconductor device with a wire bond and method for preparing the same are provided in the disclosure. The semiconductor device includes a metal oxide layer (e.g., the metal oxide layers 133 or 133') disposed over a bonding pad (e.g., the bonding pad 103 or 103'), and a wire bond (e.g., the wire bond 181) penetrating through the metal oxide layer to bond to the bonding pad. The bonding pad is entirely covered by the metal oxide layer and the wire bond after the bonding process. That is, the bonding pad is not exposed to the air. This protects the bonding pad from oxidation and contamination, and the metal oxide layer can provide mechanical support to the wire bond.

Moreover, the material of the metal oxide layer is selected such that it can be used for preventing ion migration from the bonding pad into adjacent regions. In addition, the metal oxide layer is selectively deposited (e.g., using an ALD process) over the bonding pad without performing an oxidation process, which prevents detrimental impact on device performance. As a result, the performance of the semiconductor device can be enhanced.

In one embodiment of the present disclosure, a semiconductor device is provided. The semiconductor device includes a semiconductor substrate having a bonding pad, and a first dielectric layer disposed over the semiconductor substrate. A portion of the bonding pad is exposed by the first dielectric layer. The semiconductor device also includes a metal oxide layer disposed over the portion of the bonding pad, and a wire bond penetrating through the metal oxide layer to bond to the bonding pad. The portion of the bonding pad is entirely covered by the metal oxide layer and the wire bond.

In another embodiment of the present disclosure, a semiconductor device is provided. The semiconductor device includes a semiconductor substrate having a bonding pad, and a dielectric stack disposed over the semiconductor substrate. A top surface of the bonding pad is exposed by the dielectric stack. The semiconductor device also includes a wire bond physically bonded to the top surface of the bonding pad, and a metal oxide layer disposed over the top surface of the bonding pad. The metal oxide layer is in direct contact with a bottom surface of the wire bond and sidewalls of the dielectric stack.

In yet another embodiment of the present disclosure, a method for forming a semiconductor device is provided. The method includes providing a semiconductor substrate having a bonding pad, and forming a first dielectric layer over the bonding pad. The method also includes etching the first dielectric layer to expose a top surface of the bonding pad, and selectively depositing a metal oxide layer over the top surface of the bonding pad. The method further includes bonding a wire bond to the semiconductor substrate. The wire bond penetrates through the metal oxide layer to physically contact the bonding pad.

The embodiments of the present disclosure have some advantageous features. By forming a metal oxide layer covering the bonding pad before the bonding process, the bonding pad can be prevented from oxidation and contamination before and after the bonding process, and the metal oxide layer can provide mechanical support to the wire bond. As a result, the performance of the semiconductor device can be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a semiconductor substrate having a bonding pad;
   a first dielectric layer disposed over the semiconductor substrate, wherein a portion of the bonding pad is exposed by the first dielectric layer;
   a metal oxide layer disposed over the portion of the bonding pad; and
   a wire bond penetrating through the metal oxide layer to bond to the bonding pad, wherein the portion of the bonding pad is entirely covered by the metal oxide layer and the wire bond.

2. The semiconductor device of claim 1, wherein the bonding pad comprises copper (Cu).

3. The semiconductor device of claim 1, wherein the metal oxide layer comprises tantalum (Ta), tantalum nitride (TaN), titanium (Ti), titanium nitride (TiN), or a combination thereof.

4. The semiconductor device of claim 1, wherein the metal oxide layer comprises a splash structure protruding from a top surface of the metal oxide layer, and a bottom surface of the wire bond is surrounded by and in direct contact with the splash structure of the metal oxide layer.

5. The semiconductor device of claim 1, further comprising:
   a second dielectric layer disposed over the first dielectric layer; and
   a third dielectric layer disposed over the second dielectric layer, wherein the first dielectric layer, the second dielectric layer and the third dielectric layer have substantially aligned sidewalls.

6. The semiconductor device of claim 5, further comprising:
   a polymer layer covering a top surface of the third dielectric layer and the sidewalls of the first dielectric layer, the second dielectric layer and the third dielectric layer.

7. The semiconductor device of claim 6, wherein the polymer layer is in direct contact with the metal oxide layer and the wire bond.

8. A semiconductor device, comprising:
   a semiconductor substrate having a bonding pad;
   a dielectric stack disposed over the semiconductor substrate, wherein a top surface of the bonding pad is exposed by the dielectric stack;
   a wire bond physically bonded to the top surface of the bonding pad; and
   a metal oxide layer disposed over the top surface of the bonding pad, wherein the metal oxide layer is in direct contact with a bottom surface of the wire bond and sidewalls of the dielectric stack.

9. The semiconductor device of claim 8, wherein the metal oxide layer surrounds and mechanically supports the bottom surface of the wire bond.

10. The semiconductor device of claim 8, wherein the bonding pad comprises copper (Cu), and the metal oxide layer comprises tantalum (Ta), tantalum nitride (TaN), titanium (Ti), titanium nitride (TiN), or a combination thereof.

11. The semiconductor device of claim 8, wherein the dielectric stack comprises a first dielectric layer, a second dielectric layer disposed over the first dielectric layer, and a third dielectric layer disposed over the second dielectric layer, and wherein the first dielectric layer and the second dielectric layer are made of different materials.

12. The semiconductor device of claim 11, wherein an interface between the first dielectric layer and the second dielectric layer is higher than a topmost surface of the metal oxide layer.

13. The semiconductor device of claim 8, further comprising:
   a polymer layer disposed between the wire bond and the dielectric stack, wherein the polymer layer is in direct contact with a top surface of the metal oxide layer.

14. The semiconductor device of claim 13, wherein the polymer layer comprises polyimide.

* * * * *